US008519379B2

(12) United States Patent
Yu et al.

(10) Patent No.: US 8,519,379 B2
(45) Date of Patent: Aug. 27, 2013

(54) NANOWIRE STRUCTURED PHOTODIODE WITH A SURROUNDING EPITAXIALLY GROWN P OR N LAYER

(75) Inventors: Young-June Yu, Cranbury, NJ (US); Munib Wober, Topsfield, MA (US)

(73) Assignee: Zena Technologies, Inc., Cambridge, MA (US)

( * ) Notice: Subject to any disclaimer, the term of this patent is extended or adjusted under 35 U.S.C. 154(b) by 303 days.

(21) Appl. No.: 12/633,318

(22) Filed: Dec. 8, 2009

(65) Prior Publication Data

US 2011/0133160 A1     Jun. 9, 2011

(51) Int. Cl.
*H01L 29/06* (2006.01)

(52) U.S. Cl.
USPC 257/14; 257/440; 257/E31.032; 257/E31.097; 257/E33.072; 257/E51.04; 977/762

(58) Field of Classification Search
USPC .................. 257/14, 440, E31.032, E31.097, 257/E33.072, E51.04; 977/762
See application file for complete search history.

(56) References Cited

U.S. PATENT DOCUMENTS

| | | |
|---|---|---|
| 1,918,848 A | 4/1929 | Land |
| 3,903,427 A | 9/1975 | Pack |
| 4,017,332 A | 4/1977 | James |
| 4,387,265 A | 6/1983 | Dalal |
| 4,400,221 A | 8/1983 | Rahilly |
| 4,443,890 A | 4/1984 | Eumurian |
| 4,513,168 A | 4/1985 | Borden |
| 4,827,335 A | 5/1989 | Saito |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 5,096,520 A | 3/1992 | Faris |
| 5,124,543 A | 6/1992 | Kawashima |
| 5,272,518 A | 12/1993 | Vincent |

(Continued)

FOREIGN PATENT DOCUMENTS

| | | |
|---|---|---|
| JP | 2002151715 | 5/2002 |
| JP | 2005252210 | 9/2005 |

(Continued)

OTHER PUBLICATIONS

Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.

(Continued)

*Primary Examiner* — Andy Huynh
(74) *Attorney, Agent, or Firm* — Pillsbury Winthrop Shaw Pittman LLP

(57) ABSTRACT

An embodiment relates to a device comprising a substrate, a nanowire and a doped epitaxial layer surrounding the nanowire, wherein the nanowire is configured to be both a channel to transmit wavelengths up to a selective wavelength and an active element to detect the wavelengths up to the selective wavelength transmitted through the nanowire. Another embodiment relates to a device comprising a substrate, a nanowire and one or more photogates surrounding the nanowire, wherein the nanowire is configured to be both a channel to transmit wavelengths up to a selective wavelength and an active element to detect the wavelengths up to the selective wavelength transmitted through the nanowire, and wherein the one or more photogates comprise an epitaxial layer.

34 Claims, 3 Drawing Sheets

(56) References Cited

U.S. PATENT DOCUMENTS

| | | |
|---|---|---|
| 5,311,047 A | 5/1994 | Chang |
| 5,347,147 A | 9/1994 | Jones |
| 5,362,972 A | 11/1994 | Yazawa |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach et al. |
| 5,723,945 A | 3/1998 | Schermerhorn |
| 5,747,796 A | 5/1998 | Heard |
| 5,767,507 A | 6/1998 | Unul |
| 5,798,535 A | 8/1998 | Huang |
| 5,853,446 A | 12/1998 | Carre |
| 5,877,492 A | 3/1999 | Fujieda |
| 5,880,495 A | 3/1999 | Chen |
| 5,900,623 A | 5/1999 | Tsang et al. |
| 5,943,463 A | 8/1999 | Unuma et al. |
| 6,033,582 A | 3/2000 | Lee |
| 6,037,243 A | 3/2000 | Ha et al. |
| 6,046,466 A | 4/2000 | Ishida et al. |
| 6,074,892 A | 6/2000 | Bowers et al. |
| 6,100,551 A | 8/2000 | Lee |
| 6,270,548 B1 | 8/2001 | Campbell |
| 6,326,649 B1 | 12/2001 | Chang |
| 6,388,243 B1 | 5/2002 | Berezin |
| 6,388,648 B1 | 5/2002 | Clifton |
| 6,459,034 B2 | 10/2002 | Muramoto et al. |
| 6,542,231 B1 | 4/2003 | Garrett |
| 6,566,723 B1 | 5/2003 | Vook et al. |
| 6,680,216 B2 | 1/2004 | Kwasnick et al. |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,105,428 B2 | 9/2006 | Pan |
| 7,109,517 B2 | 9/2006 | Zaidi |
| 7,153,720 B2 | 12/2006 | Augusto |
| 7,163,659 B2 | 1/2007 | Stasiak |
| 7,230,286 B2 | 6/2007 | Cohen |
| 7,235,475 B2 | 6/2007 | Kamins |
| 7,241,434 B2 | 7/2007 | Anthony |
| 7,254,151 B2 | 8/2007 | Lieber |
| 7,262,400 B2 | 8/2007 | Yaung |
| 7,265,328 B2 | 9/2007 | Mouli |
| 7,285,812 B2 | 10/2007 | Tang et al. |
| 7,306,963 B2 | 12/2007 | Linden |
| 7,307,327 B2 | 12/2007 | Bahl |
| 7,311,889 B2 | 12/2007 | Awano |
| 7,330,404 B2 | 2/2008 | Peng |
| 7,335,962 B2 | 2/2008 | Mouli |
| 7,336,860 B2 | 2/2008 | Cyr |
| 7,358,583 B2 | 4/2008 | Reznik |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,521,322 B2 | 4/2009 | Tang et al. |
| 7,598,482 B1 | 10/2009 | Verhulst |
| 7,622,367 B1 | 11/2009 | Nuzzo |
| 7,646,138 B2 | 1/2010 | Williams |
| 7,646,943 B1 | 1/2010 | Wober |
| 7,647,695 B2 | 1/2010 | MacNutt |
| 7,655,860 B2 | 2/2010 | Parsons |
| 7,663,202 B2 * | 2/2010 | Wang et al. ............ 257/461 |
| 7,704,806 B2 | 4/2010 | Chae |
| 7,713,779 B2 | 5/2010 | Firon |
| 7,719,678 B2 * | 5/2010 | Kamins et al. ............ 356/301 |
| 7,719,688 B2 | 5/2010 | Kamins |
| 7,732,839 B2 | 6/2010 | Sebe |
| 7,736,954 B2 | 6/2010 | Hussain |
| 7,740,824 B2 | 6/2010 | Godfried |
| 7,790,495 B2 | 9/2010 | Assefa et al. |
| 7,888,155 B2 | 2/2011 | Chen |
| 8,035,184 B1 | 10/2011 | Dutta et al. |
| 8,063,450 B2 * | 11/2011 | Wernersson et al. ......... 257/392 |
| 8,093,675 B2 | 1/2012 | Tsunemi et al. |
| 8,242,353 B2 | 8/2012 | Karg |
| 2002/0020846 A1 | 2/2002 | Pi et al. |
| 2002/0104821 A1 | 8/2002 | Bazylenko |
| 2002/0109082 A1 | 8/2002 | Nakayama |
| 2002/0172820 A1 | 11/2002 | Majumdar et al. |
| 2003/0003300 A1 | 1/2003 | Korgel et al. |
| 2003/0006363 A1 | 1/2003 | Campbell |
| 2003/0077907 A1 | 4/2003 | Kao et al. |
| 2003/0089899 A1 | 5/2003 | Lieber et al. |
| 2003/0103744 A1 | 6/2003 | Koyama |
| 2003/0132480 A1 | 7/2003 | Chau |
| 2003/0189202 A1 | 10/2003 | Li |
| 2003/0227090 A1 | 12/2003 | Okabe |
| 2004/0026684 A1 | 2/2004 | Empedocles |
| 2004/0058058 A1 | 3/2004 | Shchegolikhin et al. |
| 2004/0065362 A1 | 4/2004 | Watabe |
| 2004/0075464 A1 | 4/2004 | Samuelson et al. |
| 2004/0118337 A1 | 6/2004 | Mizutani |
| 2004/0122328 A1 | 6/2004 | Wang et al. |
| 2004/0124366 A1 | 7/2004 | Zeng |
| 2004/0155247 A1 | 8/2004 | Benthien |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block et al. |
| 2004/0241965 A1 | 12/2004 | Merritt |
| 2005/0082676 A1 | 4/2005 | Andry |
| 2005/0095699 A1 | 5/2005 | Miyauchi et al. |
| 2005/0116271 A1 | 6/2005 | Kato |
| 2005/0133476 A1 | 6/2005 | Islam |
| 2005/0190453 A1 | 9/2005 | Dobashi |
| 2005/0201704 A1 | 9/2005 | Ellwood |
| 2005/0218468 A1 | 10/2005 | Owen |
| 2005/0284517 A1 | 12/2005 | Shinohara |
| 2006/0113622 A1 | 6/2006 | Adkisson |
| 2006/0121371 A1 | 6/2006 | Wu |
| 2006/0146323 A1 | 7/2006 | Bratkovski |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0082255 A1 | 4/2007 | Sun |
| 2007/0099292 A1 | 5/2007 | Miller et al. |
| 2007/0104441 A1 | 5/2007 | Ahn et al. |
| 2007/0108371 A1 | 5/2007 | Stevens |
| 2007/0114622 A1 | 5/2007 | Adkisson |
| 2007/0120254 A1 | 5/2007 | Hurkx et al. |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson et al. |
| 2007/0138459 A1 | 6/2007 | Wong |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki et al. |
| 2007/0228421 A1 | 10/2007 | Shioya et al. |

| | | |
|---|---|---|
| 2007/0238285 A1 | 10/2007 | Borden |
| 2007/0246689 A1 | 10/2007 | Ge |
| 2007/0248958 A1 | 10/2007 | Jovanovich |
| 2007/0272828 A1 | 11/2007 | Xu |
| 2007/0285378 A1 | 12/2007 | Lankhorst |
| 2007/0290193 A1 | 12/2007 | Tucker |
| 2008/0001498 A1 | 1/2008 | Muller |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu et al. |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149944 A1 | 6/2008 | Samuelson |
| 2008/0166883 A1 | 7/2008 | Liu et al. |
| 2008/0169017 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi et al. |
| 2008/0246020 A1 | 10/2008 | Kawashima et al. |
| 2008/0246123 A1 | 10/2008 | Kamins |
| 2008/0248304 A1 | 10/2008 | Hanrath et al. |
| 2008/0251780 A1 | 10/2008 | Li |
| 2008/0258747 A1 | 10/2008 | Kluth |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar et al. |
| 2009/0032687 A1 | 2/2009 | Lapstun |
| 2009/0046749 A1 | 2/2009 | Mizuuchi |
| 2009/0050204 A1 | 2/2009 | Habib |
| 2009/0057650 A1 | 3/2009 | Lieber |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0165844 A1 | 7/2009 | Dutta |
| 2009/0173976 A1 | 7/2009 | Augusto |
| 2009/0179289 A1 | 7/2009 | Park |
| 2009/0188552 A1 | 7/2009 | Wang |
| 2009/0189144 A1 | 7/2009 | Quitoriano et al. |
| 2009/0189145 A1 | 7/2009 | Want et al. |
| 2009/0199597 A1 | 8/2009 | Danley |
| 2009/0201400 A1 | 8/2009 | Zhang et al. |
| 2009/0224245 A1 | 9/2009 | Umezaki |
| 2009/0233445 A1 | 9/2009 | Lee |
| 2009/0243016 A1 | 10/2009 | Kawahara et al. |
| 2009/0244514 A1 | 10/2009 | Jin |
| 2009/0260687 A1 | 10/2009 | Park |
| 2009/0266974 A1 | 10/2009 | Verhulst |
| 2009/0272423 A1 | 11/2009 | Niira |
| 2009/0278998 A1 | 11/2009 | El-Ghoroury et al. |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |
| 2010/0019355 A1 | 1/2010 | Kamins |
| 2010/0104494 A1 | 4/2010 | Meng |
| 2010/0116976 A1 | 5/2010 | Wober |
| 2010/0132779 A1 | 6/2010 | Hong |
| 2010/0133986 A1 | 6/2010 | Kim et al. |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0187404 A1 | 7/2010 | Klem |
| 2010/0200065 A1 | 8/2010 | Choi |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke et al. |
| 2010/0244169 A1 | 9/2010 | Maeda et al. |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0282314 A1 | 11/2010 | Coakley |
| 2010/0295019 A1 | 11/2010 | Wang et al. |
| 2010/0304061 A1 | 12/2010 | Ye et al. |
| 2010/0308214 A1 | 12/2010 | Wober |
| 2010/0320444 A1 | 12/2010 | Dutta |
| 2011/0036396 A1 | 2/2011 | Jayaraman |
| 2011/0037133 A1 | 2/2011 | Su et al. |
| 2011/0080508 A1 | 4/2011 | Katsuno et al. |
| 2011/0133060 A1 | 6/2011 | Yu et al. |
| 2011/0133160 A1 | 6/2011 | Yu et al. |
| 2011/0135814 A1 | 6/2011 | Miyauchi et al. |
| 2011/0139176 A1 | 6/2011 | Cheung et al. |
| 2011/0147870 A1 | 6/2011 | Ang et al. |
| 2011/0180894 A1 | 7/2011 | Samuelson |
| 2011/0195577 A1 | 8/2011 | Kushibiki et al. |
| 2011/0226937 A1 | 9/2011 | Yu et al. |
| 2011/0253982 A1 | 10/2011 | Wang et al. |
| 2011/0272014 A1 | 11/2011 | Mathai et al. |
| 2011/0309237 A1 | 12/2011 | Seo et al. |
| 2011/0315988 A1 | 12/2011 | Yu et al. |
| 2011/0316106 A1 | 12/2011 | Kim |
| 2012/0009714 A1 | 1/2012 | Mouli |

FOREIGN PATENT DOCUMENTS

| | | |
|---|---|---|
| JP | 2007201091 | 8/2007 |
| WO | 8603347 | 6/1986 |
| WO | 0002379 | 1/2000 |
| WO | 2005064337 | 7/2005 |
| WO | 2008069565 | 6/2008 |
| WO | 2008079076 A1 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 2009116018 | 9/2009 |
| WO | 2009137241 | 11/2009 |
| WO | 2010019887 | 2/2010 |
| WO | 2010039631 | 4/2010 |

OTHER PUBLICATIONS

Madou, Properties and Growth of Silicon, Including Crystalline Silicon, Fundamentals of Microfabrication, 2nd Ed., CRC Press, 2002, pp. 125-204.

Holmes et al., Control of Thickness and Orientation of Solution-Grown Silicon Nanowires, Science, Feb. 25, 2000, vol. 287, No. 5457, pp. 1471-1473.

Morales et al., A Laser Ablation Method for the Synthesis of Crystalline Semiconductor Nanowires, Science, Jan. 9, 1998, vol. 279, pp. 208-211.

Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.

Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.

Wagner et al., Vapor-Liquid-Solid Mechanism of Single Crystal Growth, Applied Physics Letters, Mar. 1, 1964, vol. 4, No. 5, pp. 89-90.

Law et al., Semiconductor Nanowires and Nanotubes, Annu. Rev. Mater. Res., 2004, vol. 34, pp. 83-122.

Hochbaum et al., Controlled Growth of Si Nanowire Arrays for Device Integration, Nano Letters, Mar. 2005, vol. 5, No. 3, pp. 457-460.

Ge et al., Orientation-Controlled Growth of Single-Crystal Silicon-Nanowire Arrays, Advanced Materials, Jan. 18, 2005, vol. 17, No. 1, pp. 56-61.

Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.

International Search Report and Written Opinion for PCT International Patent Application No. PCT/US2009/063592, mailed Jan. 13, 2010.

Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.

International Search Report and Written Opinion for PCT International Patent Application No. PCT/US2010/059491, mailed Feb. 9, 2011.

International Search Report and Written Opinion for PCT International Patent Application No. PCT/US2010/059504, mailed Apr. 7, 2011.

International Search Report and Written Opinion for PCT International Patent Application No. PCT/US2010/051435, mailed Dec. 3, 2010.

International Search Report and Written Opinion for PCT International Patent Application No. PCT/US2010/059468, mailed Feb. 11, 2011.

International Search Report and Written Opinion for PCT International Patent Application No. PCT/US2010/059501, mailed Feb. 15, 2011.

Adler, Nanowire Lawns Make for Sheets of Image Sensors, NewScientist.com, Jul. 28, 2008.

International Search Report and Written Opinion for PCT International Patent Application No. PCT/US2010/051446, mailed Jan. 3, 2011.

Kim et al., Electronic Structure of Vertically Aligned Mn-Doped CoFe2O4 Nanowires and Their Application as Humidity Sensors and Photodetectors, Journal of Physical Chemistry C, Apr. 7, 2009.

Shimizu et al., Homoepitaxial Growth of Vertical Si Nanowires on Si(100) Substrate using Anodic Aluminum Oxide Template, (abstract only), Materials Research Society.

Song et al., Vertically Standing Ge Nanowires on GaAs(110) Substrates, Nanotechnology 19, Feb. 21, 2008.

"CMOS image sensor pixel optical efficiency and optical crosstalk optimization using FDTD Solutions" www.lumerical.com/fdtd_microlens/cmos_image_sensor_pixel_microlens.php, Mar. 19, 2009.

Furumiya, et al. "High-sensitivity and no-crosstalk pixel technology for embedded CMOS image sensor"; IEEE Electron Device Letters, vol. 48, No. 10, Oct. 2001.

International Search Report and Written Opinion for PCT International Application No. PCT/US2010/035722, mailed Jul. 20, 2010.

T. H. Hsu, et al. 'Light Guide for Pixel Crosstalk Improvement in Deep Submicron CMOS Image Sensor'; IEEE Electron Device Letters, vol. 25, No. 1, Jan. 2004.

Tseng, et al. 'Crosstalk improvement technology applicable to 0.14μm CMOS image sensor'; IEEE International Electron Devices Meeting, Dec. 13-15, 2004; IEDM Technical Digest, pp. 997-1000. vbTab.

CMOS image sensor pixel microlens array optimization using FDTD Solutions, http://www.lumerical_com/ fdtd_microlens/cmos_image_sensor_pixel_microlens.php, pp. 1-2, Jun. 25, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL:<http://otd.harvard.edu/technologies/tech.php?case=3702>.

Baillie et al., 'Zero-space microlenses for CMOS image sensors: optical modeling and lithographic process development', Publication Date May 2004, http://adsabs.harvard.edu/abs/2004SPIE.5377.. 953B, pp. 1-2.vbTab.

Barclay et al., Chip-Based Microcavities Coupled to NV Centers in Single Crystal Diamond, Applied Physics Letters, Nov. 12, 2009, vol. 95, Issue 19.

Brouri et al., Photon Antibunching in the Flurescence of Individual Colored Centers in Diamond, Optics Letters, Sep. 1, 2000, vol. 25, Issue 17.

Chung, Sung-Wook et al. Silicon Nanowire Devices. Applied Physics Letters, vol. 76, No. 15 (Apr. 10, 2000), pp. 2068-2070.

Deptuch et al., Vertically Integrated Circuits at Fermilab, IEEE Transactions on Nuclear Science, Aug. 2010, vol. 54, Issue 4, pp. 2178-2186.

Ekroll, On the Nature of Simultaneous Color Contrast, Dissertation, University of Kiel, 2005.

Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.

Fang et al., Fabrication of Slantingly-Aligned Silicon Nanowire Arrays for Solar Cell Applications, Nanotechnology, 2008, vol. 19, No. 25.

Gadelrab et al., The Source-Gated Amorphous Silicon Photo-Transistor, IEEE Transactions on Electron Devices, Oct. 1997, vol. 44, No. 10, pp. 1789-1794.

Gambino et al., 'CMOS Imager with Copper Wiring and Lightpipe,' Electron Devices Meeting, 2006. IEDM '06, International Publication Date: Dec. 11-13, 2006, pp. 1-4.

Garnett et al., Light Trapping in Silicon Nanowire Solar Cells, Nanoletters, Jan. 28, 2010, vol. 10, No. 3, pp. 1082-1087.

Guillaumée, et al., Polarization Sensitive Silicon Photodiodes Using Nanostructured Metallic Grids, Applied Physics Letters 94, 2009.

International Preliminary Report on Patentability for PCT International Patent Application No. PCT/U62009/055963, mailed Mar. 17, 2011.

International Search Report and Written Opinion for PCT International Application No. PCT/US2010/035726, mailed Jul. 21, 2010.

International Search Report and Written Opinion for PCT International Application No. PCT/US2010/057227, mailed Jan. 26, 2011.

International Search Report and Written Opinion for PCT International Patent Application No. PCT/US2009/055963, mailed Oct. 15, 2009.vbTab.

International Search Report and Written Opinion for PCT International Patent Application No. PCT/US2010/035727, mailed Sep. 27, 2010.

Jin-Kon Kim; 'New Functional Nanomaterials Based on Block Copolymers' http://www.ziu.edu.cn/adver/subjectizyhd/jz0707061313.html.

Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.

Junger, et. al., Polarization- and wavelength-sensitive sub-wavelength structures fabricated in the metal layers of deep submicron CMOS processes, Proc. of SPIE, vol. 7712, 2010.

Kalkofen et al., Atomic Layer Deposition of Boron Oxide As Dopant Source for Shallow Doping of Silicon, Meeting Abstract 943, 217th ECS Meeting, MA2010-01, Apr. 25-30, 2010, Vancouver Canada, El—Advanced Gate Stack, Source / Drain, and Channel Engineering for Si-Based CMOS 6: New Materials, Processes, and Equipment.

Kane, Why Nanowires Make Great Photodetectors, EurekAlert.com article, Apr. 25, 2007.

Kempa, Thomas J. et al. Single and Tandem Axial p-i-n Nanowire Photovoltaic Devices. Nano Letters. 2008, vol. 8, No. 10, 3456-3460.

Lee et al., Vertical Pillar-Superlattice Array and Graphene Hybrid Light Emitting Diodes, Nano Letters, 2010, Vol_ 10, pages 2783-2788.

Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.

Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

Loncar et al., Diamond Nanotechnology, SPIE Newsroom, May 18, 2010, obtained at url: <http://spie.org/x40194.xml?ArticleID=x40194>.

Loose et al., CMOS Detector Technology, Scientific Detector Workshop, Sicily, 2005, Experimental Astronomy, vol. 19, Issue 1-3, pp. 111-134.

Makarova et al., Fabrication of High Density, High-Aspect-Ratio Polyimide Nanofilters, Journal of Vacuum Science and Technology, Nov./Dec. 2009, vol. 27, No. 6., pp. 2585-2587.

N.L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.

Nguyen et al., Deep Reactive Ion etching of Polyimide for Microfluidic Applications, Journal of the Korean Physical Society, Sep. 2007, vol. 51, No. 3, pp. 984-988.

Ozgur Yavuzcetin, et al.; 'Index-tuned Anti-reflective Coating using a Nanostructured Metamaterial'; http://www.umass.edu/research/rld/bioportal/vuewtech.php?tid=40.

Parraga et al., Color and Luminance Information in Natural Scenes, Journal of Optical Society of America A, Optics, Image, Science and Vision, Jun. 1998, vol. 15, No. 6.

Reynard Corporation; 'Anti-Reflection Coatings (AR)', http://www.reynardcorp.com/coating_anti_reflection.php.

Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.

Rugani, First All-Nanowire Sensor, Technology Review, Aug. 13, 2008, Published by MIT.

Rutter, Diamond-Based Nanowire Devices Advance Quantum Science, Seas Communications, Feb. 14, 2010, obtained at url:<http://news.harvard.edu/gazette/story/2010/02/digging-deep-into-diamonds/>.

Sarkar et. al., Integrated polarization-analyzing CMOS image sensor for detecting incoming light ray direction, Sensors Application Symposium (SAS) p. 194-199, 1010 IEEE.

Schmidt et al., Realization of a Silicon Nanowire Vertical Surround-Gate Field-Effect Effect Transistor, Small, Jan. 2006, vol. 2, No. 1, pp. 85-88.

Thelander et al., Nanowire-Based One-Dimensional Electronics, Materials Today, Oct. 2006, vol. 9, No. 10, pp. 28-35.

Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.

Verheijen, Marcel A. et al. Growth Kinetics of Heterostructured GaP-GaAs Nanowires. J. Am. Chem. Soc. 2006, 128, 1353-1359.

Wang, Introduction to Nanotechnology—Where Opportunities arise & Great Future Being Built from Small Things.

Wong et al., Lateral Nanoconcentrator Nanowire Multijunction Photovoltaic Cells, GCEP Progress report, Apr. 20, 2009, pp. 1-18.

Ye et al., Fabrication Techniques of High Aspect Ratio Vertical Lightpipes Using a Dielectric Photo Mask, SPIE, Proceedings, Feb. 2010, vol. 7591.

Zhang et al., Ultrahigh Responsivity Visible and Infrared Detection Using Silicon Nanowire Phototransistors, Nanoletters, May 14, 2010, vol. 10, No. 6, pp. 2117-2120.

William Shockley and H. Queisser, Detailed Balance Limit of Efficiency of p-n Junction Solar Cells, J. of Appl. Physics, 1961, Mar. 32(3).

International Preliminary Report on Patentability for PCT International Application No. PCT/US2010/035722, mailed Nov. 3, 2011.

International Preliminary Report and Written Opinion re PCT/US2010/059491, mailed Jun. 21, 2012.

International Preliminary Report and Written Opinion re PCT/US2010/059468, mailed Jun. 21, 2012.

U.S. Office Action for U.S. Appl. No. 12/573,582, dated Jun. 28, 2012.

International Preliminary Report and Written Opinion re PCT/US2010/059504, mailed Jun. 21, 2012.

International Preliminary Report and Written Opinion re PCT/US2010/059496, mailed Jun. 21, 2012.

International Search Report and Written Opinion re PCT/US2011/57325, mailed Jun. 22, 2012.

International Search Report and Written Opinion for PCT International Patent Application No. PCT/US2011/060348, mailed Mar. 9, 2012.

International Search Report and Written Opinion for PCT International Patent Application No. PCT/US2011/064635, mailed Apr. 13, 2012.

International Search Report and Written Opinion for PCT International Patent Application No. PCT/US2011/066097, mailed Mar. 12, 2012.

International Search Report and Written Opinion for PCT International Patent Application No. PCT/US2011/067712, mailed May 3, 2012.

Baomin Wang and Paul W. Leu, Nanotechology 23 (2012) 194003, 7 pages.

Sangmoo Jeon, et al., Nano Lett. 2012, 12, 2971-2976.

Sangmoo Jeong et al., J. Vac. Sci. Technol. A 30(6), Nov./Dec. 2012.

Sarkar et. al., Integrated polarization-analyzing CMOS image sensor for detecting incoming light ray direction, Sensors Application Symposium (SAS), Mar. 29, 2012, p. 194-199, 1010 IEEE.

Jin-Kon Kim; 'New Functional Nanomaterials Based on Block Copolymers' http://www.ziu.edu.cn/adver/subjectizyhd/jz0707061313.html, Jul. 7, 2011.

Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.

Reynard Corporation; 'Anti-Reflection Coatings (AR)', http://www.reynardcorp.com/coating_anti_reflection.php, undated.

Shimizu et al., Homoepitaxial Growth of Vertical Si Nanowires on Si(100) Substrate using Anodic Aluminum Oxide Template, (abstract only), Materials Research Society, Fall 2007.

Wang, Introduction to Nanotechnology—Where Opportunities arise & Great Future Being Built from Small Things, Fall 2008.

* cited by examiner

NANOWIRE STRUCTURED PHOTODIODE WITH A SURROUNDING EPITAXIALLY GROWN P OR N LAYER

RELATED APPLICATION

This application is related to U.S. application Ser. No. 12/621,497, filed on Nov. 19, 2009, which is incorporated herein in its entirety by reference.

FIELD OF INVENTION

This application generally relates to semiconductor manufacturing, and in particular, the fabrication of nanowire structured photodiode with a surrounding epitaxially grown P or N layer.

BACKGROUND

Complementary metal-oxide semiconductor (CMOS) image sensors are increasingly being used in the commercial market due to their ease of integration, low cost and reduced power consumption.

An image sensor may be fabricated to have a large number of identical sensor elements (pixels), generally more than 1 million, in a (Cartesian) square grid. The pixels may be photodiodes, or other photosensitive elements, that are adapted to convert electromagnetic radiation into electrical signals. However, as the pixel size decreases, the imager's sensitivity is reduced and crosstalk among pixels is increased.

Today, the predominant type of photodiodes (PDs) are built on planar technology by a process of etching and depositing a number of layers of oxides of silicon, metal and nitride on top of crystalline silicon. The PN junction is constructed as a plurality of layers on a substrate giving a device with an essentially horizontal orientation. The light-detection takes place in a subset of these layers.

Light pipes have been introduced into solid state image devices to confine and transmit electromagnetic radiation impinging thereupon to the photosensitive elements.

The development of nanoscale technology and the ability to produce nanowires has opened up possibilities of designing structures and combining materials in ways not possible in planar technology. For example, in US Publication No. 20040075464 by Samuelson et al, a plurality of devices based on nanowire structures are disclosed.

SUMMARY

An embodiment relates to a device comprising a substrate, a nanowire and a doped epitaxial layer surrounding the nanowire, wherein the nanowire is configured to be both a channel to transmit wavelengths up to a selective wavelength and an active element to detect the wavelengths up to the selective wavelength transmitted through the nanowire.

For example, the epitaxial layer surrounds a part of all of the nanowire.

The device could further comprise a metal-containing layer surrounding the doped epitaxial layer.

For example, the metal-containing layer is configured to confine light within the metal-containing layer and function as an electronic component.

For example, the metal-containing layer is configured to confine light within the metal-containing layer and not function as an electronic component.

The device could further comprise a dielectric layer surrounding the doped epitaxial layer.

The device could further comprise a dielectric layer between the nanowire and the doped epitaxial layer.

For example, the substrate has a front side and a back-side, the nanowire disposed on the back-side and an image sensing circuit disposed on the front side.

For example, the substrate has a front side and a back-side, wherein both the nanowire and an image sensing circuit are disposed on the front side.

For example, the nanowire is not transparent.

For example, the device does not include a color or infrared filter.

For example, the nanowire comprises a semiconductor.

The device could further comprise a lens structure or an optical coupler over the nanowire, wherein the lens structure or the optical coupler is operably coupled to the nanowire.

The device could further comprise an anti-reflective layer disposed on the substrate.

For example, the device is an image sensor.

For example, the selective wavelength is a function of the diameter of the nanowire.

For example, the nanowire is configured to be a PN or PIN junction.

For example, the doped epitaxial layer comprises a p doped layer.

For example, the doped epitaxial layer comprises a n-doped layer.

For example, the nanowire is doped or undoped.

Yet another embodiment relates to a device comprising a substrate, a nanowire and one or more photogates surrounding the nanowire, wherein the nanowire is configured to be both a channel to transmit wavelengths up to a selective wavelength and an active element to detect the wavelengths up to the selective wavelength transmitted through the nanowire, and wherein the one or more photogates comprise an epitaxial layer.

The device could further comprise a dielectric layer between the nanowire and the one or more photogates.

For example, the substrate has a front side and a back-side, the nanowire disposed on the back-side and an image sensing circuit disposed on the front side.

For example, the substrate has a front side and a back-side, wherein both the nanowire and an image sensing circuit are disposed on the front side.

For example, the device does not include a color or infrared filter.

The device could further comprise an anti-reflective layer disposed on the substrate.

For example, the selective wavelength is a function of the diameter of the nanowire.

The device could further comprise photodiode disposed in or on the substrate.

For example, the one more photogates comprises a first photogate configured to be a switch and a second photogate configured to control a potential in the nanowire.

For example, wherein the epitaxial layer comprises an epitaxial metal or metal oxide layer.

Other features of one or more embodiments of this disclosure will seem apparent from the following detailed description, and accompanying drawings, and the appended claims.

DESCRIPTION OF THE FIGURES

Embodiments of the present disclosure will now be disclosed, by way of example only, with reference to the accompanying schematic drawings in which corresponding reference symbols indicate corresponding parts.

DETAILED DESCRIPTION

Figure 1:
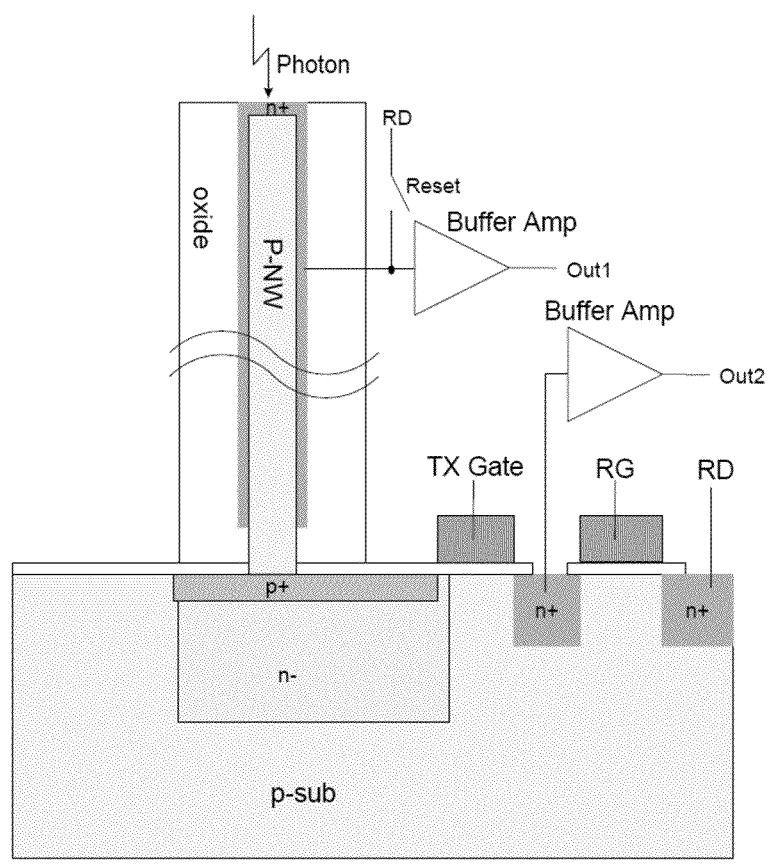
FIG. 1 shows a cross section view of a dual photodiode structure in which the nanowire is coated with an epitaxial n+ layer to form a p-n junction.

In the following detailed description, reference is made to the accompanying drawings, which form a part thereof. In the drawings, similar symbols typically identify similar components, unless the context dictates otherwise. The illustrative embodiments described in the detail description, drawings, and claims are not meant to be limiting. Other embodiments may be utilized, and other changes may be made, without departing from the spirit or scope of the subject matter presented here.

Symbols for elements illustrated in the figures are summarized in the following table. The elements are described in more detail below.

| Symbol | Element |
| --- | --- |
| VPG 1 (VP Gate 1) | The first vertical photogate |
| VPG 2 (VP Gate 1) | The second vertical photogate |
| TX Gate | Transfer gate |
| RG | Reset gate |
| RD | Reset drain |
| Sub | substrate |
| Out | Output |
| NW (nw) | Nanowire |
| PG | photogate |
| I (i) | Current |
| n+, n− | Semiconducting material with excess donors, n+ is heavily doped, n− is lightly doped |
| p+, p− | Semiconducting material with excess acceptors, p+ is heavily doped, p− is lightly doped |

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

The term nanowire refers to a structure that has a thickness or diameter of the order of nanometers, for example, 100 nanometers or less and an unconstrained length. Nanowires could include metallic (e.g., Ni, Pt, Au), semiconducting (e.g., Si, InP, GaN, etc.), and insulating (e.g., $SiO_2$, $TiO_2$) materials. Molecular nanowires are composed of repeating molecular units either organic or inorganic. Nanowires could exhibit aspect ratios (length-to-width ratio) of 1000 or more. As such they could be referred to as 1-dimensional materials. Nanowires could have many interesting properties that are not seen in bulk or 3-D materials. This is because electrons in nanowires could be quantum confined laterally and thus occupy energy levels that could be different from the traditional continuum of energy levels or bands found in bulk materials. As a result, nanowires could have discrete values of electrical and optical conductance. Examples of nanowires include inorganic molecular nanowires ($Mo_6S_{9-x}I_x$, $Li_2Mo_6Se_6$), which could have a diameter of 0.9 nm, and can be hundreds of micrometers long. Other important examples are based on semiconductors such as InP, Si, GaN, etc., dielectrics (e.g. $SiO_2$, $TiO_2$), or metals (e.g. Ni, Pt).

The term excitons refer to electron hole pairs.

An active element is any type of circuit component with the ability to electrically control electron and/or hole flow (electricity controlling electricity or light, or vice versa). Components incapable of controlling current by means of another electrical signal are called passive elements. Resistors, capacitors, inductors, transformers, and even diodes are all considered passive elements. Active elements include in embodiments disclosed herein, but are not limited to, an active waveguide, transistors, silicon-controlled rectifiers (SCRs), light emitting diodes, and photodiodes.

A waveguide is a system or material designed to confine and direct electromagnetic radiation of selective wavelengths in a direction determined by its physical boundaries. Preferably, the selective wavelength is a function of the diameter of the waveguide. An active waveguide is a waveguide that has the ability to electrically control electron and/or hole flow (electricity controlling electricity or light, or vice versa). This ability of the active waveguide, for example, is one reason why the active waveguide could be considered to be "active" and within the genus of an active element.

An optical pipe is an element to confine and transmit an electromagnetic radiation that impinges on the optical pipe. The optical pipe can include a core and a cladding. The core could be a nanowire. The optical pipe could be configured to separate wavelengths of an electromagnetic radiation beam incident on the optical pipe at a selective wavelength through the nanowire and the cladding, wherein the nanowire is configured to be both a channel to transmit the wavelengths up to the selective wavelength and an active element to detect the wavelengths up to the selective wavelength transmitted through the core. A core and a cladding are generally complimentary components of the optical pipe and are configured to separate wavelengths of an electromagnetic radiation beam incident on the optical pipe at a selective wavelength through the core and cladding.

A photogate is a gate used in an optoelectronic device. Typically, the photogate comprises a metal-oxide-semiconductor (MOS) structure. The photogate could contain an epitaxial metal or metal oxide layer. The photogate accumulates photo generated charges during the integration time of the photodiode and controls the transfer of charges when integration is over. A photodiode could comprises a pn junction. A photogate can be placed on any type semiconductor material. A vertical photogate is a new structure. Normally, photogates are placed on a planar photodiode devices. In a nanowire device, however, the photogate can be formed in a vertical direction. That is, standing up covering the lateral surface of the nanowire. The photogate could include an epitaxial metal oxide thin film microstructure, for example, made of an alkaline earth metal oxide of $SrTiO_3$ (STO) because of its high bulk dielectric constant.

A transfer gate is a gate of a switch transistor used in a pixel. The transfer gate's role is to transfer the charges from one side of a device to another. In some embodiments, the transfer gate is used to transfer the charges from the photodiode to the sensing node (or floating diffusion). A reset gate is a gate used for resetting a device. In some embodiments, the device is the sense node which is formed by an n+ region. Reset means to restore to original voltage level set by a certain voltage. In some embodiments, the voltage of the reset drain (RD) is the voltage used as a reset level.

A floating capacitor is a capacitor which floats relative to the substrate. Normally a capacitor consists of two electrodes and an insulator between them. Typically, both of the electrodes are connected to other device or signal lines. In a pixel, often one of the electrodes may not be connected to a structure, like a floating ice cube in the water. This unconnected, isolated area forms the floating capacitor with respect to the substrate. In other words, the isolated area comprises one electrode which is floating. The substrate comprises the other electrode which is normally connected to the ground. A depletion region between them comprises the insulator.

A global connection is a connection in which many branch nodes are connected to a single line electrically so that one signal line can control the multiple branched devices at the same time. A source-follower amplifier is a common drain transistor amplifier. That is, a transistor amplifier whose source node follows the same phase as the gate node. The gate terminal of the transistor serves as the input, the source is the output, and the drain is common to both (input and output). A shallow layer is a doped layer that is physically located near the surface of the substrate. For example, a p+ layer may be intentionally formed very shallow by using very low energy when ion implantation is used. Normally the junction depth of a shallow layer is 0.01 μm~0.2 μm. In contrast, a deep layer may be as deep as a few μm to tens of μm.

An intrinsic semiconductor, also called an undoped semiconductor or i-type semiconductor, is a pure semiconductor without any significant dopant species present. The number of charge carriers is therefore determined by the properties of the material itself instead of the amount of impurities. In intrinsic semiconductors, the number of excited electrons and the number of holes are equal: n=p. The conductivity of intrinsic semiconductors can be due to crystal defects or to thermal excitation. In an intrinsic semiconductor, the number of electrons in the conduction band is equal to the number of holes in the valence band.

Shallow trench isolation (STI), also known as 'Box Isolation Technique', is an integrated circuit feature which prevents electrical current leakage between adjacent semiconductor device components. STI is generally used on CMOS process technology nodes of 250 nanometers and smaller. Older CMOS technologies and non-MOS technologies commonly use isolation based on LOCal Oxidation of Silicon (LOCOS). STI is typically created early during the semiconductor device fabrication process, before transistors are formed. Steps of the STI process include etching a pattern of trenches in the silicon, depositing one or more dielectric materials (such as silicon dioxide) to fill the trenches, and removing the excess dielectric using a technique such as chemical-mechanical planarization.

Epitaxy refers to the method of depositing a monocrystalline film on a monocrystalline substrate. The deposited film is denoted as epitaxial film or epitaxial layer. The term epitaxy comes from the Greek roots roots epi, meaning "above", and taxis, meaning "in ordered manner". It can be translated "to arrange upon".

Epitaxial films may be grown from gaseous or liquid precursors. Because the substrate acts as a seed crystal, the deposited film takes on a lattice structure and orientation identical to those of the substrate. This is different from other thin-film deposition methods which deposit polycrystalline or amorphous films, even on single-crystal substrates. If a film is deposited on a substrate of the same composition, the process is called homoepitaxy; otherwise it is called heteroepitaxy.

Homoepitaxy is a kind of epitaxy performed with only one material. In homoepitaxy, a crystalline film is grown on a substrate or film of the same material. This technology is applied to growing a more purified film than the substrate and fabricating layers with different doping levels.

Heteroepitaxy is a kind of epitaxy performed with materials that are different from each other. In heteroepitaxy, a crystalline film grows on a crystalline substrate or film of another material. This technology is often applied to growing crystalline films of materials of which single crystals cannot be obtained and to fabricating integrated crystalline layers of different materials. Examples include gallium nitride (GaN) on sapphire or aluminium gallium indium phosphide (AlGaInP) on gallium arsenide (GaAs).

Heterotopotaxy is a process similar to heteroepitaxy except for the fact that thin film growth is not limited to two dimensional growth. Here the substrate would be similar only in structure to the thin film material.

Epitaxy could be used in silicon-based manufacturing processes for CMOS, and compound semiconductors such as gallium arsenide. Preferably, during manufacturing epitaxial film or layer, there should be control of the amount and uniformity of the deposition's resistivity and thickness, cleanliness and purity of the surface and the chamber atmosphere, prevention of the typically much more highly doped substrate wafer's diffusion of dopant to the new layers, prevention of imperfections of the growth process, and protection the surfaces during the manufacture and handling.

An epitaxial layer can be doped during deposition by adding impurities to the source gas, such as arsine, phosphine or diborane. The concentration of impurity in the gas phase determines its concentration in the deposited film. As in CVD, impurities change the deposition rate. Additionally, the high temperatures at which CVD is performed may allow dopants to diffuse into the growing layer from other layers in the wafer ("out-diffusion"). Also, dopants in the source gas, liberated by evaporation or wet etching of the surface, may diffuse into the epitaxial layer ("autodoping"). The dopant profiles of underlying layers may change as well, however not as significantly.

The image sensor according to the embodiments herein comprises a substrate and an upstanding nanowire protruding from the substrate. The upstanding nanowire could be on the front side or the back side of the substrate. A substrate of the embodiments herein typically have electronic components and the nanowire photodiode. In the front-side nanowire structure, the upstanding nanowire is on the same side of the substrate where the electronic components are located while in the back-side nanowire structure, the upstanding nanowire is located on the side of the substrate opposite to the side where the electronic components are located in or on the substrate.

The image sensor may further comprise a volume element epitaxially formed around the nanowire. The volume element could provide a high doping degree for the formation of an active region, typically within or close to the nanowire, with or without requiring the nanowire itself to be doped.

The nanowire technology offers possibilities in choices of materials and material combinations not possible in conventional bulk layer techniques. The design according to the embodiments herein allows for inclusions of heterostructures as well as areas of different doping within the nanowire, facilitating optimization of electrical and/or optical properties.

The nanowire could also serve as a photodiode by absorbing the confined light and generating electron hole pairs (excitons). Excitons so generated can be detected by using at least one of the following: (1) A device comprising a substrate, a nanowire and a doped epitaxial layer surrounding the nanowire, wherein the nanowire is configured to be both a channel to transmit wavelengths up to a selective wavelength and an active element to detect the wavelengths up to the selective wavelength transmitted through the nanowire. The nanowire and the doped epitaxial layer forms a PN or PIN junction that induces a potential gradient. The PN or PIN junction could be formed by growing a nanowire, doping the nanowire if needed, epitaxially growing a doped epitaxial layer surrounding the nanowire, and forming a dielectric layer, if needed, surrounding doped epitaxial layer. (2) A device comprising a nanowire and a vertical photogate surrounding the nanowire, wherein the nanowire is configured to be both a channel to transmit wavelengths up to a selective wavelength and an active element to detect the wavelengths up to the selective wavelength transmitted through the nanowire, and wherein the vertical photogate comprises an epitaxial metal or metal oxide layer.

The photosensitive elements of the embodiments typically comprise a photodiode, although not limited to only a photodiode. Typically, the photodiode is doped to a concentration from about $1 \times 10^{16}$ to about $1 \times 10^{18}$ dopant atoms per cubic centimeter, while using an appropriate dopant.

The image sensor could have different stacking layers. The stacking layers could comprise dielectric material-containing and metal-containing layers. The dielectric materials include as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant dielectric materials may include, but are not limited to hafnium oxides, hafnium silicates, titanium oxides, barium-strontium titanates (BSTs) and lead-zirconate titanates (PZTs).

The dielectric material-containing layers may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods.

The metal-containing layers could function as electrodes. Non-limiting examples include certain metals, metal alloys, metal silicides and metal nitrides, as well as doped polysilicon materials (i.e., having a dopant concentration from about $1 \times 10^{18}$ to about $1 \times 10^{22}$ dopant atoms per cubic centimeter) and polycide (i.e., doped polysilicon/metal silicide stack) materials. The metal-containing layers may be deposited using any of several methods. Non-limiting examples include chemical vapor deposition methods (also including atomic layer chemical vapor deposition methods) and physical vapor deposition methods. The metal-containing layers could comprise a doped polysilicon material (having a thickness typically in the range 1000 to 1500 Angstrom The dielectric and metallization stack layer comprises a series of dielectric passivation layers. Also embedded within the stack layer are interconnected metallization layers. Components for the pair of interconnected metallization layers include, but are not limited to contact studs, interconnection layers, interconnection studs.

The individual metallization interconnection studs and metallization interconnection layers that could be used within the interconnected metallization layers may comprise any of several metallization materials that are conventional in the semiconductor fabrication art. Non-limiting examples include certain metals, metal alloys, metal nitrides and metal silicides. Most common are aluminum metallization materials and copper metallization materials, either of which often includes a barrier metallization material, as discussed in greater detail below. Types of metallization materials may differ as a function of size and location within a semiconductor structure. Smaller and lower-lying metallization features typically comprise copper containing conductor materials. Larger and upper-lying metallization features typically comprise aluminum containing conductor materials.

The series of dielectric passivation layers may also comprise any of several dielectric materials that are conventional in the semiconductor fabrication art. Included are generally higher dielectric constant dielectric materials having a dielectric constant from 4 to about 20. Non-limiting examples that are included within this group are oxides, nitrides and oxynitrides of silicon. For example, the series of dielectric layers may also comprise generally lower dielectric constant dielectric materials having a dielectric constant from about 2 to about 4. Included but not limiting within this group are hydrogels such as silicon hydrogel, aerogels like silicon Al, or carbon aerogel, silsesquioxane spin-on-glass dielectric materials, fluorinated glass materials, organic polymer materials, and other low dielectric constant materials such as doped silicon dioxide (e.g., doped with carbon, fluorine), and porous silicon dioxide.

The dielectric and metallization stack layer could comprise interconnected metallization layers and discrete metallization layers comprising at least one of copper metallization materials and aluminum metallization materials. The dielectric and metallization stack layer also comprises dielectric passivation layers that also comprise at least one of the generally lower dielectric constant dielectric materials disclosed above. The dielectric and metallization stack layer could have an overall thickness from about 1 to about 4 microns. It may comprise from about 2 to about 4 discrete horizontal dielectric and metallization component layers within a stack.

The layers of the stack layer could be patterned to form patterned dielectric and metallization stack layer using methods and materials that are conventional in the semiconductor fabrication art, and appropriate to the materials from which are formed the series of dielectric passivation layers. The dielectric and metallization stack layer may not be patterned at a location that includes a metallization feature located completely therein. The dielectric and metallization stack layer may be patterned using wet chemical etch methods, dry plasma etch methods or aggregate methods thereof. Dry plasma etch methods as well as e-beam etching if the dimension needs to be very small, are generally preferred insofar as they provide enhanced sidewall profile control when forming the series of patterned dielectric and metallization stack layer.

A planarizing layer may comprise any of several optically transparent planarizing materials. Non-limiting examples include spin-on-glass planarizing materials and organic polymer planarizing materials. The planarizing layer could extend above the optical pipe such that the planarizing layer would have a thickness sufficient to at least planarize the opening of the optical pipe, thus providing a planar surface for fabrication of additional structures within the CMOS image sensor. The planarizing layer could be patterned to form the patterned planarizing layer.

Preferably, the image sensor should contain no color or infra-red (IR) filter. Optionally, there could be a series of color filter layers located upon the patterned planarizing layer. The series of color filter layers, if present, would typically include either the primary colors of red, green and blue, or the complementary colors of yellow, cyan and magenta. The series of color filter layers would typically comprise a series of dyed or pigmented patterned photoresist layers that are intrinsically imaged to form the series of color filter layers.

Alternatively, the series of color filter layers may comprise dyed or pigmented organic polymer materials that are otherwise optically transparent, but extrinsically imaged while using an appropriate mask layer. Alternative color filter materials may also be used. The filter could also be filter for a black and white, or IR sensors wherein the filter cuts off visible and pass IR predominantly.

The spacer layer could be one or more layers made of any material that physically, but not optically, separates the stacking layers from a micro lens on the top of the optical pipe near the incident electromagnetic radiation beam receiving end of the image sensor. The function of the micro lens or in more general terms is to be a coupler, i.e., to couple the incident electromagnetic radiation beam into the optical pipe. If one were to choose a micro lens as the coupler in this embodiment, its distance from the optical pipe would be much shorter than to the photosensitive element, so the constraints on its curvature are much less stringent, thereby making it implementable with existing fabrication technology. The spacer layer could be formed of a dielectric spacer material or a laminate of dielectric spacer materials, although spacer layers formed of conductor materials are also known. Oxides, nitrides and oxynitrides of silicon are commonly used as dielectric spacer materials. Oxides, nitrides and oxynitrides of other elements are not excluded. The dielectric spacer materials may be deposited using methods analogous, equivalent or identical to the methods described above. The spacer layer could be formed using a blanket layer deposition and etchback method that provides the spacer layer with the characteristic inward pointed shape.

The micro lens may comprise any of several optically transparent lens materials that are known in the art. Non-limiting examples include optically transparent inorganic materials, optically transparent organic materials and optically transparent composite materials. Most common are optically transparent organic materials. Typically the lens layers could be formed incident to patterning and reflow of an organic polymer material that has a glass transition temperature lower than the series of color filter layers, if present, or the patterned planarizing layer.

The waveguiding properties of the nanowire can be improved in different ways. The nanowire could have a first effective refractive index, nw, and a cladding surrounding at least a portion of the nanowire could have a second effective refractive index, nc, and by assuring that the first refractive index is larger than the second refractive index, nw>nc., good wave-guiding properties could be provided to the nanowire. The waveguiding properties may be further improved by introducing an optically active cladding.

The high index material in the nanowire could, for example, be silicon nitride having a refractive index of about 2.0. The lower index cladding layer material could, for example, be a glass, for example a material selected from Table I, having a refractive index about 1.5.

TABLE I

Typical Material Index of Refraction

| Micro Lens (Polymer) | 1.583 |
| Spacer | 1.512 |
| Color Filter | 1.541 |
| Planarization | 1.512 |
| PESiN | 2.00 |
| PESiO | 1.46 |
| SiO | 1.46 |

In Table I, PESiN refers to plasma enhanced SiN and PESiO refers to plasma enhanced SiO.

By nesting nanowire structured photodiodes, an array of image sensors could be configured to obtain complementary colors having wavelengths of electromagnetic radiation separated at a cutoff wavelength in the nanowire and cladding of each optical pipe of every image sensor. The complementary colors are generally two colors when mixed in the proper proportion produce a neutral color (grey, white, or black). This configuration also enables the capture and guiding of most of the electromagnetic radiation incident beam impinging on the micro lens to the photosensitive elements (i.e., photodiodes) located at the lower end of the optical pipe. Two adjacent or substantially adjacent image sensors with different color complementary separation can provide complete information to reconstruct a full color scene according to embodiments described herein. This technology of embodiments disclosed herein can further supplant pigment based color reconstruction for image sensing which suffers from the inefficiency of discarding (through absorption) the non selected color for each pixel.

Each physical pixel of a device containing an image sensor of the embodiments disclosed herein would have two outputs representing the complementary colors, e.g., cyan (or red) designated as output type 1 and yellow (or blue) designated as output type 2. These outputs would be arranged as follows:

```
1 2 1 2 1 2 1 2 1 2 1 2 1 2 1 2 . . .
2 1 2 1 2 1 2 1 2 1 2 1 2 1 2 1 . . .
1 2 1 2 1 2 1 2 1 2 1 2 1 2 1 2 . . .
. . . . . . . . . . . . . . . . . . . . . . .
. . . . . . . . . . . . . . . . . . . . . . .
```

Each physical pixel would have complete luminance information obtained by combining its two complementary outputs. As a result, the same image sensor can be used either as a full resolution black and white or full color sensor.

In the embodiments of the image sensors disclosed herein, the full spectrum of wavelengths of the incident electromagnetic radiation beam (e.g., the full color information of the incident light) could be obtained by the appropriate combination of two adjacent pixels either horizontally or vertically as opposed to 4 pixels for the conventional Bayer pattern.

Depending on minimum transistor sizes, each pixel containing an image sensor of the embodiments disclosed herein could be as small as 1 micron or less in pitch and yet have sufficient sensitivity. This could open the way for contact imaging of very small structures such as biological systems.

The embodiments, which include a plurality of embodiments of an image sensor, as well as methods for fabrication thereof, will be described in further detail within the context of the following description. The description is further understood within the context of the drawings described above. The drawings are for illustrative purposes and as such are not necessarily drawn to scale.

An embodiment of a compound pixel comprises a system of two pixels, each having a nanowire of a different diameter such that cores have diameters $d_1$ and $d_2$ for directing light of different wavelengths ($\lambda_B$ and $\lambda_R$). The two cores also serve as photodiodes to capture light of wavelengths $\lambda_B$ and $\lambda_R$. The claddings of the two image sensors serve for transmitting the light of wave length $\lambda_{w-B}$ and $\lambda_{w-R}$. The light of wave length $\lambda_{w-B}$ and $\lambda_{w-R}$ transmitted through the cladding is detected by the peripheral photosensitive elements surrounding the cores. Note that (w) refers to the wavelength of white light. Signals from the 4 photodiodes (two located in the cores and two located in or on the substrate surrounding the core) in the compound pixel are used to construct color.

The embodiments include a nanostructured photodiode (PD) according to the embodiments comprise a substrate and an upstanding nanowire protruding from the substrate. A pn-junction giving an active region to detect light may be present within the structure. The nanowire, a part of the nanowire, or a structure in connection with the nanowire, forms a waveguide directing and detecting at least a portion of the light that impinges on the device. In addition the waveguide doubles up as spectral filter that enables the determination of the color range of the impinging light.

A nanostructured PD according to the embodiments comprises of an upstanding nanowire. For the purpose of this application an upstanding nanowire should be interpreted as a nanowire protruding from the substrate in some angle, the upstanding nanowire for example being grown from the substrate, preferably by as vapor-liquid-solid (VLS) grown nanowires. The angle with the substrate will typically be a result of the materials in the substrate and the nanowire, the surface of the substrate and growth conditions. By controlling these parameters it is possible to produce nanowires pointing in only one direction, for example vertical, or in a limited set of directions. For example nanowires and substrates of zinc-blende and diamond semiconductors composed of elements from columns III, V and IV of the periodic table, such nanowires can be grown in the [111] directions and then be grown in the normal direction to any {111} substrate surface. Other directions given as the angle between normal to the surface and the axial direction of the nanowire include 70.53° {111}, 54.73° {100}, and 35.27° and 90°, both to {110}. Thus the nanowires define one, or a limited set, of directions.

According to the embodiments, a part of the nanowire or structure formed from the nanowire could be used as a waveguide directing and confining at least a portion of the light impinging on the nanostructured PD in a direction given by the upstanding nanowire. The waveguiding nanostructured PD structure could include a high refractive index nanowire with one or more surrounding cladding with refractive indices less than that of the core. The structure could be either circular symmetrical or close to being circular symmetrical. Light waveguiding in circular symmetrical structures are well know for fiber-optic applications and many parallels can be made to the area of rare-earth-doped fiber optic devices. However, one difference is that fiber amplifier are optically pumped to enhance the light guided through them while the described nanostructured PD can be seen as an efficient light to electricity converter. One well known figure of merit is the so called Numerical Aperture, NA. The NA determines the angle of light captured by the waveguide. The NA and angle of captured light is an important parameter in the optimization of a new PD structure.

For a PD operating in IR and above IR, using GaAs could be good, but for a PD operating in the visible light region, silicon would be preferable. For example to create circuits, Si and doped Si materials are preferable. Similarly, for a PD working in the visible range of light, one would prefer to use Si.

In one embodiment, the typical values of the refractive indexes for III-V semiconductor nanowire material are in the range from 2.5 to 5.5 when combined with glass type of cladding material (such as $SiO_2$ or $Si_3N_4$) having refractive indexes ranging from 1.4 to 2.3. A larger angle of capture means light impinging at larger angles can be coupled into the waveguide for better capture efficiency.

One consideration in the optimization of light capture is to provide a coupler into the nanowire structure to optimize light capture into the structure. In general, it would be preferred to have the NA be highest where the light collection takes place. This would maximize the light captured and guided into the PD.

A nanostructured PD according to the embodiments could comprise a substrate and a nanowire epitaxially grown from the substrate in an defined angle θ. A portion of or all of the nanowire could be arranged to act as a waveguiding portion directing at least a portion of the impinging light in a direction given by the elongated direction of the nanowire, and will be referred to as a waveguide. In one possible implementation, a pn-junction necessary for the diode functionality could be formed by varying the doping of the wire along its length while it is growing. Two contact could be provided on the nanowire for example one on top or in a wrapping configuration on the circumferential outer surface and the other contact could be provided in the substrate. The substrate and part of the upstanding structure may be covered by a cover layer, for example as a thin film as illustrated or as material filling the space surrounding the nanostructured PD.

The nanowire could have a diameter in the order of 50 nm to 500 nm, The length of the nanowire could be of the order of 1 to 10 µm. The pn-junction results in an active region arranged in the nanowire. Impinging photons in the nanowire are converted to electron hole pairs and in one implementation are subsequently separated by the electric fields generated by the PN junction along the length of the nanowire. The materials of the different members of the nanostructured PD are chosen so that the nanowire will have good waveguiding properties vis-a-vis the surrounding materials, i.e. the refractive index of the material in the nanowire should preferably be larger than the refractive indices of the surrounding materials.

In addition, the nanowire may be provided with one or more layers. A first layer, may be introduced to improve the surface properties (i.e., reduce charge leakage) of the nanowire. Further layers, for example an optical layer may be introduced specifically to improve the waveguiding properties of the nanowire, in manners similar to what is well established in the area of fiber optics. The optical layer typically has a refractive index in between the refractive index of the nanowire and the surrounding cladding region material. Alternatively the intermediate layer has a graded refractive index, which has been shown to improve light transmission in certain cases. If an optical layer is utilized the refractive index of the nanowire, $n_w$, should define an effective refractive index for both the nanowire and the layers.

The ability to grow nanowires with well defined diameters could be to optimize the waveguiding properties of the nanowire or at least the waveguide with regards to the wavelength of the light confined and converted by the nanostructured PD. The diameter of the nanowire could be chosen so as to have a favorable correspondence to the wavelength of the desired light. Preferably the dimensions of the nanowire are such that a uniform optical cavity, optimized for the specific wavelength of the produced light, is provided along the nanowire. The nanowire generally is sufficiently wide to capture the desired light. A rule of thumb would be that diameter must be larger than $\lambda/2n_w$, wherein $\lambda$ is the wavelength of the desired light and $n_w$ is the refractive index of the nanowire. As an example a diameter of about 60 nm may be appropriate to confine blue light only and one 80 nm may be appropriate for to confine both blue and green light only in a silicon nanowire.

In the infra-red and near infra-red a diameter above 100 nm would be sufficient. An approximate preferred upper limit for the diameter of the nanowire is given by the growth constrains, and could be in the order of 500 nm. The length of the nanowire is typically and preferably in the order of 1-10 μm, providing enough volume for the light conversion region A reflective layer could be in one embodiment, provided on the substrate and extending under the wire. The purpose of the reflective layer is to reflect light that is guided by the wire but has not been absorbed and converted to carriers in the nanostructured PD. The reflective layer is preferably provided in the form of a multilayered structure comprising repeated layers of silicates for example, or as a metal film. If the diameter of the nanowire is sufficiently smaller than the wavelength of the light a large fraction of the directed light mode will extend outside the waveguide, enabling efficient reflection by a reflective layer surrounding the narrow the nanowire waveguide An alternative approach to getting a reflection in the lower end of the nanowire could be to arrange a reflective layer in the substrate underneath the nanowire. Yet another alternative could be to introduce reflective means within the waveguide. Such reflective means can be a multilayered structure provided during the growth process of the nanowire, the multilayered structure comprising repeated layers of for example $SiN_x/SiO_x$ (dielectric).

To form the pn-junction necessary for light detection at least part of the nanostructure is preferably doped. This could be done by either changing dopants during the growth of the nanowire or using a radial shallow implant method on the nanowire once it is grown.

Considering systems where nanowire growth is locally enhanced by a substance, as vapor-liquid-solid (VLS) grown nanowires, the ability to alter between radial and axial growth by altering growth conditions enables the procedure (nanowire growth, mask formation, and subsequent selective growth) can be repeated to form nanowire/3D-sequences of higher order. For systems where nanowire growth and selective growth are not distinguished by separate growth conditions it may be better to first grow the nanowire along the length and by different selective growth steps grow different types of D regions.

Depending on the intended use of the nanostructured PD, availability of suitable production processes, costs for materials etc., a wide range of materials can be used for the different parts of the structure. In addition, the nanowire based technology allows for defect free combinations of materials that otherwise would be impossible to combine. The III-V semiconductors are of particular interest due to their properties facilitating high speed and low power electronics. Suitable materials for the substrate include, but is not limited to: Si, GaAs, GaP, GaP:Zn, GaAs, InAs, InP, GaN, $Al_2O_3$, SiC, Ge, GaSb, ZnO, InSb, SOI (silicon-on-insulator), CdS, ZnSe, CdTe. Suitable materials for the nanowire 110 include, but is not limited to: Si, GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb. Possible donor dopants for e.g. GaP, Te, Se, S, etc, and acceptor dopants for the same material are Zn, Fe, Mg, Be, Cd, etc. It should be noted that the nanowire technology makes it possible to use nitrides such as SiN, GaN, InN and AlN, which facilitates fabrication of PDs detecting light in wavelength regions not easily accessible by conventional technique. Other combinations of particular commercial interest include, but is not limited to GaAs, GaInP, GaAlInP, GaP systems. Typical doping levels range from $10^{18}$ to $10^{20}$ A person skilled in the art is though familiar with these and other materials and realizes that other materials and material combinations are possible.

The appropriateness of low resistivity contact materials are dependent on the material to be deposited on, but metal, metal alloys as well as non-metal compounds like Al, Al—Si, $TiSi_2$, TiN, W, $MoSi_2$, PtSi, $CoSi_2$, $WSi_2$, In, AuGa, AuSb, AuGe, PdGe, Ti/Pt/Au, Ti/Al/Ti/Au, Pd/Au, ITO (InSnO), etc. and combinations of e.g. metal and ITO can be used.

The substrate could be an integral part of the device, since it also contains the photodiodes necessary to detect light that has not been confined to the nanowire. The substrate in addition also contains standard CMOS circuits to control the biasing, amplification and readout of the PD as well as any other CMOS circuit deemed necessary and useful. The substrate include substrates having active devices therein. Suitable materials for the substrates include silicon and silicon-containing materials. Generally, each sensor element of the embodiments include a nanostructured PD structure comprise a nanowire, a cladding enclosing at least a portion of the nanowire, a coupler and two contacts.

The fabrication of the nanostructured PDs on silicon is possible to the degree that the nanowires are uniformly aligned the (111) direction normal to the substrates and essentially no nanowires are grown in the three declined (111) directions that also extends out from the substrate. The well aligned growth of III-V nanowires in predefined array structures on silicon substrates, is preferred for successful large scale fabrication of optical devices, as well as most other applications.

PD devices build on silicon nanowires are of high commercial interest due to their ability to detect light of selected wavelengths not possible with other material combinations. In addition they allow the design of a compound photodiode that allows the detection of most of the light that impinges on a image sensor.

EXAMPLES

FIG. 1 shows a cross section view of a dual photodiode structure in which the p doped nanowire is coated with an epitaxial n+ layer to form a p-n junction. In an alternative embodiment (now shown), the nanowire could be n doped and the coating could be an epitaxial p+ layer to form a p-n junction.

In FIG. 1, there are two photodiodes in a pixel, a nanowire (NW) diode and a substrate diode. The nanowire is formed with p-type (it does not have to be p−) and a n+ layer cover the nanowire surface to form a p-n junction. In the substrate a n− diode is lightly doped so that a n− region can be depleted easily by a low bias voltage. Photo charges are integrated in both of the photodiodes at the same time, but integrated in separate potential wells because the photodiodes are separated by a p+ layer to avoid interaction between the two photodiodes. There are two separate readout circuits which consist of the reset switches and buffer amplifiers. The reset switch for the nanowire photodiode is shown as a circuit symbol and another reset switch for the substrate diode is shown connected to the vertical nanowire-containing structure FIG. 1.

Figure 2:
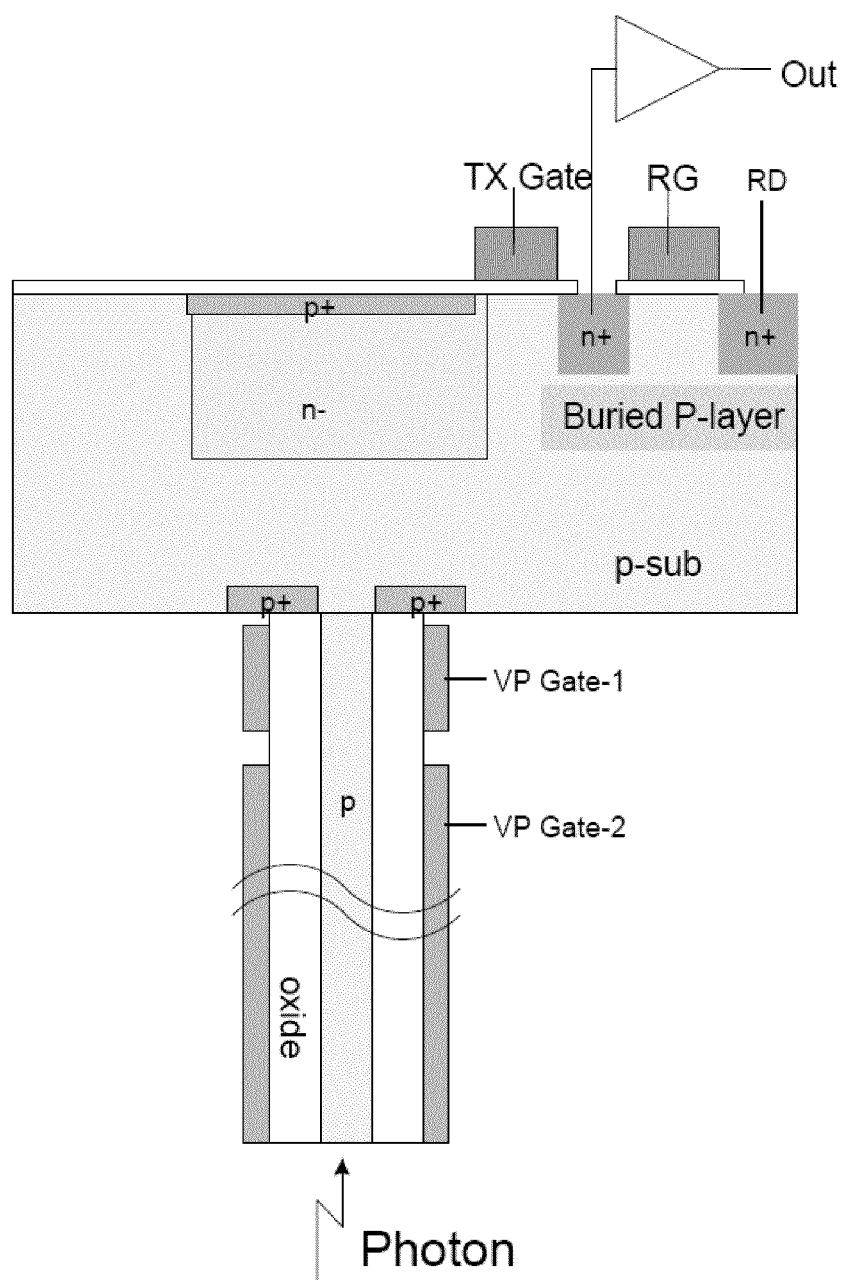
FIG. 2 shows a cross-sectional view of a pixel structure with a backside nanowire and dual vertical photogates.
Figure 3:
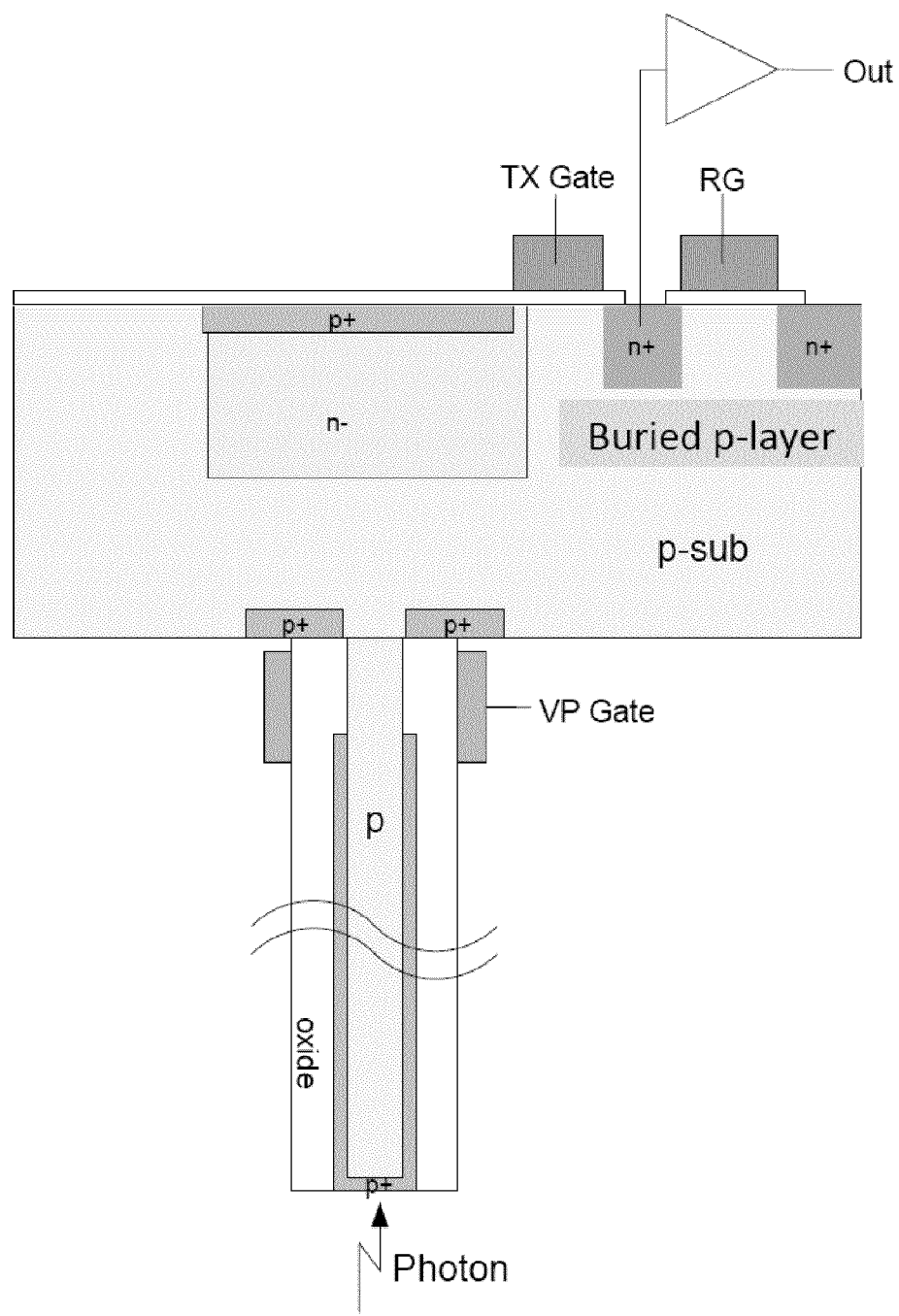
FIG. 3 shows a cross-sectional view of a pixel structure with a backside nanowire and a vertical gate.

FIG. 2 and FIG. 3 show embodiments showing nanowires on the back-side of a fully processed wafer containing a substrate photodiode. In an embodiment, such as that shown in FIG. 2 or FIG. 3, the nanowire photodiode sensors could be provided with one or more vertical photogates comprising epitaxially grown layers such as epitaxially grown semiconductor, metal oxide or metal layers.

Vertical photogates allow the ability to easily modify and control the potential profile in the semiconductor without using a complicated ion implantation process. The conventional photogate pixel suffers from very poor quantum efficiency and poor blue response. The conventional photogate is normally made of polysilicon which absorbs short wavelengths near blue light, thus reducing the blue light reaching the photodiode. Further, the conventional photogate pixel is placed on top of the photodiode. The vertical photogate (VPG) structure, in contrast, does not block the light path. This is because the vertical photogate (VPG) does not lie laterally across the photodiode to control the potential profile in the semiconductor.

Additionally, as the pixel size of image sensors scale down, the aperture size of the image sensor becomes comparable to the wavelength. For a conventional planar type photodiode, this results in a poor quantum efficiency (QE). The combination of a VPG structure with a nanowire sensor, however, allows for a ultra small pixel with good quantum efficiency.

In one embodiment such as that shown in FIG. 2, a nanowire pixel could have a dual vertical photogate structure. This embodiment could include two photodiodes, a nanowire photodiode and a substrate photodiode. This embodiment also includes two vertical photogates (VP Gate 1, VP Gate 2), a transfer gate (TX) and a reset gate (RG). Preferably, both of the photodiodes are lightly doped. This is because a lightly doped region can be easily depleted with a low bias voltage. As illustrated, both of the photodiodes are n−. Alternatively, however, the nanowire pixel could be configured so that both photodiodes are p−.

The surface region of the substrate photodiode could be prone to defects due to process induced damage caused during fabrication and to lattice stress associated with the nanowire. These defects serve as a source for dark current. To suppress the dark current at the surface of the n− photodiode, preferably, a p+ region is fabricated on top of the n− photodiode in the substrate.

Preferably, the substrate is connected to ground, that is, zero voltage. In this embodiment the reset gate is preferably doped n+ and is positively biased. When the transfer gate TX and reset gates are on, the n− region in the substrate becomes positively biased. This results in the n− region becoming depleted due to the reverse bias condition between the p substrate and n− region. When the transfer gate TX and reset gate RG are off, the n− region retains its positive bias, forming a floating capacitor with respect to the p-sub region.

The first vertical photogate VP Gate 1 could be configured to control the potential in the nanowire so that a potential difference can be formed between the nanowire photodiode and the substrate photodiode. In this way, electrons in the nanowire can drift quickly to n− region of the substrate during the readout.

The second photogate VP Gate-2 could be a on/off switch. This switch could be configured to separate the signal charges generated in the nanowire from the signal charges integrated in the substrate photodiode. Photo charges are integrated in both the nanowire and substrate photodiodes at the same time, but integrated in separate potential wells because the off-state of the second photogate VP Gate-2 forms a potential barrier between them. In this manner the nanowire and substrate photodiodes do not get mixed together.

The nanowire photosensor of the present embodiment uses a two step process to read out the signals separately between the nanowire and substrate photodiodes. In the first step, the signal charges in the substrate photodiode are read out. Then, the n-region in the substrate is depleted. In the second step, the second photogate VP Gate 2 could be first turned on. Then, signal charges in the nanowire are read out.

In a "snapshot" operation, preferably all of the second photogates VP Gate 2 are turned on or off at the same time. The same could be true for the transfer gate TX. To accomplish this, the second photogates VP Gate 2 are all connected with a global connection. Further, all the transfer gates TX are connected with a second global connection.

Generally, global operation of the reset gate RG should generally be avoided for practical reasons. In pixel arrays, it is a common practice to globally reset the array row by row. That is, it is, an entire array of pixels is generally not rested at the same time. If snapshot operation is not used, individual pixel operation is possible. In this case, it is not necessary to have global connections.

To make the back-side illuminated image sensor of FIG. 2, the wafer is thinned by removing silicon over the area containing the photodiode array. For example, a doped p− substrate (p-sub) of FIG. 2 could be the thinned to a thickness between 3 and 50 microns, more preferably, between 6 and 20 microns. The substrate photodiode could now gets all of its light from the back-side and not from the side where all the metal lines are as in conventional image sensors.

The nanowire could be formed at the backside of the doped p− substrate shown in FIG. 2. At the front side, there could be a buffer amplifier and an n− diode with a p+ layer on it as shown in FIG. 2. The purpose of having p+ at both sides of the substrate is to suppress the dark current. A buried p-layer could be placed underneath the n+ diffusion layer to block the incoming charge flow from the backside and deflect the charges toward the n− layer. Preferably, doping of the buried p-layer is higher than that of the doped p− substrate, but not as high as that of the p+ layer. The front side photodiode is not for photo absorption, but rather for collecting the charges coming from the backside p-substrate where photo absorption takes place. The nanowire could have an oxide layer (cladding layer) surrounding the nanowire and two vertical photogates, one for the switch and the other for controlling the potential in the nanowire.

Typically, in the embodiment of FIG. 2, it would take a two step process to read out the signal charges separately from each of the photo diodes. The first step would be to read out the charges from the p-sub diode. Immediately after this, by turning on the VP gate-1, the charges from the nanowire would be read out.

Preferably, the embodiment of FIG. 2 should have a shallow p+ layer with a hole in the center so that the p+ layer may not block the carriers coming from the back-side nanowire. Also, preferably at the front side there should be the N-well or lowly doped n-layer underneath the shallow p+ layer. The lowly doped N-well could be depleted easily. If p+ and n+ layers were to meet together, there could be a breakdown at low voltage like a Zener diode.

FIG. 3 shows another embodiment of a back-side illuminated image sensor. In this embodiment, instead of having a vertical photogate for the nanowire, the p+ layer could be coated at the surface of the nanowire to help create a built-in electric field in the nanowire so that electrons can drift easily in the upward direction. The features of the back-side illuminated image sensor are similar to those of the image sensor of FIG. 2.

In the embodiments herein, silicon nanowires (NW) could be grown on a layer of silicon. The process could apply for growing Si NW on dielectric layer, or for III-V compound grown on the appropriate substrate, including Si substrate with or without a thin Molybdenum layer.

The silicon nanowire of the embodiments disclosed herein could be made as follows. A substrate is provided which comprises silicon having a silicon dioxide surface. The surface can be modified with a surface treatment to promote adsorption of a gold nanoparticle. Onto this modified surface, the gold nanoparticle can be formed by deposition of a gold layer, followed by removal of the gold layer over regions other than desired location of the gold nanoparticle. The gold nanoparticle can be surface treated to provide for steric stabilization. In other words, tethered, sterically stabilized gold nanoparticles can be used as seeds for further synthesis of nanowires, wherein the gold nanoparticles are adsorbed to the modified silicon substrate. The degradation of diphenyl silane (DPS) to forms silicon atoms. The silicon atoms attach to the gold nanoparticle and a silicon nanowire crystallizes from the gold nanoparticle seed upon saturation of the gold nanoparticle with silicon atoms. Note that the thickness and diameter of the gold particle left behind on the back-side surface determines the diameter of the nanowire.

A silicon nanowire can be grown, for example, by plasma enhanced vapor-liquid-solid growth. In some embodiments, silicon NWs (SiNW) are be grown using the vapor-liquid-solid (VLS) growth method. In this method, a metal droplet catalyzes the decomposition of a Si-containing source gas. Silicon atoms from the gas dissolves into the droplet forming a eutectic liquid. The eutectic liquid functions as a Si reservoir. As more silicon atoms enter into solution, the eutectic liquid becomes supersaturated in silicon, eventually causing the precipitation of Si atoms. Typically, the Si precipitates out of the bottom of the drop, resulting in bottom up growth of a Si—NW with the metal catalyst drop on top.

In some embodiments, gold is used as the metal catalyst for the growth of silicon NWs. Other metals, however, may be used, including, but not limited to, Al, GA, In, Pt, Pd, Cu, Ni, Ag, and combinations thereof. Solid gold may be deposited and patterned on silicon wafers using conventional CMOS technologies, such as sputtering, chemical vapor deposition (CVD), plasma enhanced chemical vapor deposition (PECVD), evaporation, etc. Patterning may be performed, for example, with optical lithography, electron-beam lithography, or any other suitable technique. The silicon wafer can then be heated, causing the gold to form droplets on the silicon wafer. Silicon and gold form a eutectic at 19% Au having a melting temperature at 363° C. That is, a liquid drop of Si—Au eutectic forms at 363° C., a moderate temperature suitable for the processing of silicon devices.

In some embodiments, the substrates have a (111) orientation. Other orientations, however, may also be used, including, but not limited to (100). A common silicon source gas for NW production is $SiH_4$. Other gases, however, may be used including, but not limited to, $SiCl_4$. In some embodiments, NW growth may be conducted, for example, with $SiH_4$ at pressures of 80-400 mTorr and temperatures in the range of 450-600° C. In some embodiments, the temperature is in a range of 470-540° C. Typically, lower partial pressures of $SiH_4$ result in the production of a higher percentage of vertical nanowires (NW). For example, at 80 mTorr partial pressure and 470° C., up to 60% of the SiNWs grow in the vertical <111> direction. In some embodiments, NWs may be grown which are essentially round. In other embodiments, the NW are hexagonal.

In one embodiment, NW growth is conducted in a hot wall low pressure CVD reactor. After cleaning the Si substrates with acetone and isopropanol the samples may be dipped in a buffered HF solution to remove any native oxide. Successive thin Ga and Au metal layers (nominally 1-4 nm thick) may deposited on the substrates by thermal evaporation. Typically, the Ga layer is deposited before the Au layer. In an embodiment, after evacuating the CVD-chamber down to approximately $10^{-7}$ torr, the substrates can be heated up in vacuum to 600° C. to form metal droplets. The Si—NWs can be grown, for example, at a total pressure of 3 mbar using a 100 sccm flow of $SiH_4$ (2% in a He mixture) in a temperature range from 500° C. to 700° C.

The size and length of the Si—NWs grown with a Au—Ga catalyst are relatively homogeneous, with most of the wires oriented along the four <111> directions. For comparison, Si—NWs grown with a pure Au catalyst nucleate and grow with lengths and diameters of the NWs more randomly distributed. Further, NWs grown with a Au—Ga catalyst tend to have a taper along the axial direction. The tip diameters of NWs grown for a long time are the same as those grown for a short time and are determined by the catalyst diameter. The footprints of the NWs, however, tend to increase during the course of the growth. This indicates that NW tapering is caused primarily by sidewall deposition (radial growth) of silicon. NWs may be grown having a diameter at the foot (base) of 1500 nm, while the diameter of the tip may less than 70 nm over a length of 15 µm. Further, the NW diameter is a function of growth temperature. Higher growth temperatures result in NW with smaller diameters. For example, the average diameter of NWs grown with the Ga/Au catalyst at 600° C. is about 60 nm but the average diameter decreases down to about 30 nm for growth at 500° C. Additionally, the variation in diameters tends to narrow as deposition temperature is lowered.

Using the VLS process, vertical NWs may be grown. That is, nanowires which are essentially perpendicular to the substrate surface. Typically, not all NW will be perfectly vertical. That is, the NWs may be tilted at an angle to the surface other than 90 degrees. Commonly observed tilted NWs include, but are not limited to, the three 70.5°-inclined <111> epitaxial growth directions and three additional 70.5°-inclined directions, which are rotated by 60°.

In addition to growing vertical NWs, the VLS process may be used to grow doped NWs. Indeed, by changing the composition of the source gases, a doping profile in the growing wire can be produced. For example, the NW can be made p-type by adding diborane ($B_2H_2$) or trimethyl borane (TMB) to the source gas. Other gases that add acceptor atoms to the silicon NW may also be used. The NW can be made n-type by adding $PH_3$ or $AsH_3$ to the source gas. Other gases that add donor atoms to the silicon NW may also be used. Doping profiles which can be produced, include but are not limited to, n-p-n, p-n-p, and p-i-n.

Additionally, other methods or variations of the VLS method may be used to grow NWs. Other methods or variation include, but are not limited to, (1) CVD, (2) reactive atmosphere, (3) Evaporation, (4) molecular beam epitaxy (MBE), (5) laser ablation, and (6) solution methods. In the CVD process, a volatile gaseous silicon precursor is provided. Example silicon precursor gases include $SiH_4$ and $SiCl_4$. CVD may be used for epitaxial growth. Further, doping can be accomplished by adding volatile doping precursors to the silicon precursor Annealing in a reactive atmosphere comprises heating the substrate in a gas that reacts with the substrate. For example, if silicon is annealed in an atmosphere including hydrogen, the hydrogen locally reacts with the silicon substrate, forming $SiH_4$. The $SiH_4$ can then react with the catalyst metal drop, thereby initiating NW growth. This growth process can be used for non-CMOS processes.

In the evaporation method, a $SiO_2$ source is heated under conditions that result in the production of SiO gas. When the SiO gas adsorbs on the metal catalyst droplets, it forms Si and $SiO_2$. This method may also be performed without a metal catalyst drop. Absent a metal catalyst, $SiO_2$ has been observed to catalyze silicon NW growth. In the MBE method, a high purity silicon source is heated until Si atoms evaporate. A gaseous beam of Si directed toward the substrate. The gaseous silicon atoms adsorb onto and dissolve into the metal droplet, thereby initiating growth of NWs.

In the laser ablation method, a laser beam is aimed at source which includes both silicon and catalyst atoms. The ablated atoms cool by colliding with inert gas molecules and condense to form droplets with the same composition as the original target. That is, droplets having both silicon and catalyst atoms. The laser ablation method may also be performed with a target consisting essentially of pure silicon. Solution based techniques typically use organic fluids. Specifically, the organic fluids generally comprise highly pressurized supercritical organic fluids enriched with a silicon source and catalyst particles. At a reaction temperature above the metal-silicon eutectic, the silicon precursor decomposes, forming an alloy with the metal. Upon supersaturation, silicon precipitates out, growing the NW.

The above nanowire growth techniques are all bottom up techniques. Nanowires, however may also be fabricated with top down techniques. Top down techniques typically involve patterning and etching a suitable substrate, for example silicon. Patterning can be accomplished via lithography, for, example, electron beam lithography, nanosphere lithography and nanoprint lithography. Etching may be performed either dry or wet. Dry etching techniques include, but are not limited to, reactive ion etching. Wet etching may be performed with either standard etches or via the metal-assisted etching process. In the metal-assisted etching process, Si is wet-chemically etched, with the Si dissolution reaction being catalyzed by the presence of a noble metal that is added as a salt to the etching solution.

Subsequent steps could relate to the forming of an epitaxial layer that is n or p doped covering the nanowire (in case of the device of FIG. 1) or of one or more of the dielectric layers around the nanowire (in case of the device of FIG. 2 and FIG. 3).

The epitaxial n or p doped layer covering the nanowire in FIG. 1 could be grown using vapor-phase epitaxy (VPE), a modification of chemical vapor deposition. Molecular-beam epitaxy, liquid-phase epitaxy (MBE and LPE) and solid-phase epitaxy (SPE) could also be used. In each of these processes, a dopant could be added into the epitaxially grown layer during the epitaxial layer growth process.

In the vapor-phase growth process, silicon could be deposited from silicon tetrachloride in hydrogen at approximately 1200° C.:

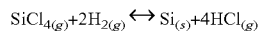

$$SiCl_{4(g)} + 2H_{2(g)} \leftrightarrow Si_{(s)} + 4HCl_{(g)}$$

This reaction is reversible, and the growth rate depends strongly upon the proportion of the two source gases. Growth rates above 2 micrometers per minute produce polycrystalline silicon, and negative growth rates (etching) may occur if too much hydrogen chloride byproduct is present. (For example, hydrogen chloride may be added intentionally to etch the wafer.) An additional etching reaction competes with the deposition reaction:

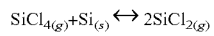

$$SiCl_{4(g)} + Si_{(s)} \leftrightarrow 2SiCl_{2(g)}$$

Silicon VPE may also use silane, dichlorosilane, and trichlorosilane source gases. For instance, the silane reaction occurs at 650° C. in this way:

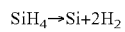

$$SiH_4 \rightarrow Si + 2H_2$$

This reaction does not inadvertently etch the wafer, and takes place at lower temperatures than deposition from silicon tetrachloride. However, it would generally form a polycrystalline film unless tightly controlled, and it could allow oxidizing species that leak into the reactor to contaminate the epitaxial layer with unwanted compounds such as silicon dioxide.

Liquid phase epitaxy (LPE) is a method to grow semiconductor crystal layers from the melt on solid substrates. This generally happens at temperatures well below the melting point of the deposited semiconductor. The semiconductor is dissolved in the melt of another material at conditions that are close to the equilibrium between dissolution and deposition the deposition of the semiconductor crystal on the substrate is slow and uniform. Typical deposition rates for monocrystalline films range from 0.1 to 1 μm/minute. The equilibrium conditions could depend on the temperature and on the concentration of the dissolved semiconductor in the melt. The growth of the layer from the liquid phase could be controlled by a forced cooling of the melt. Impurity introduction can be strongly reduced. Doping can be achieved by the addition of dopants.

The LPE method could be used for the growth of epitaxial layers. Very thin, uniform and high quality layers can be produced. A typical example for the liquid phase epitaxy method is the growth of ternery and quarternery III-V compounds on gallium arsenide (GaAs) substrates. As a solvent quite often gallium is used in this case. Another frequently used substrate is indium phosphide (InP). However also other substrates like glass or ceramic can be applied for special applications. To facilitate nucleation, and to avoid tension in the grown layer the thermal expansion coefficient of substrate and grown layer should be similar.

Solid Phase Epitaxy (SPE) could be performed by first depositing a film of amorphous material on a crystalline substrate. The substrate could then be heated to crystallize the film. The single crystal substrate serves as a template for crystal growth. The annealing step used to recrystallize silicon layers amorphized during ion implantation could also be considered a type of SPE. The impurity segregation and redistribution at the growing crystal-amorphus layer interface during this process could be used to incorporate low-solubility dopants in metals and Silicon.

In molecular-beam epitaxy (MBE), a source material could be heated to produce an evaporated beam of particles. These particles travel through a very high vacuum ($10^{-8}$ Pa; practically free space) to the substrate, where they condense. MBE has lower throughput than other forms of epitaxy.

The conformal dielectric coating around the nanowire in FIG. 2 or FIG. 3 could be made by chemical vapor deposition (CVD), atomic layer deposition (ALD), oxidation or nitration could be made around the nanowire. Then, doped glass dielectric layer could be formed on the conformal dielectric coating by plasma enhanced chemical vapor deposition, spin-on coating or sputtering, optionally with an initial atomic layer deposition. The deposited doped glass dielectric layer could be etched back by chemical-mechanical planarization or other methods of etching.

The epitaxial metal or metal oxide layer in the vertical photogates of FIG. 2 and FIG. 3 could be made by method known to those skilled in the art for making epitaxial structures using any metal that is capable of forming an epitaxial layer. For example, Sr, Ba, Mg, Ca, and combinations thereof in the case of a substrate on which the epitaxial layer is deposited has a face-centered-cubic structure such as Si. The metal could be deposited by any of a variety of known deposition methods, including molecular-beam epitaxy (MBE), chemical vapor deposition (CVD), and e-beam evaporation, at a temperature of generally at least 750° C. while under a vacuum in which the pressure is generally less than $1 \times 10^{-8}$ Torr to form an epitaxial metal or metal oxide layer with a thickness of one or more monolayer. The epitaxial metal or metal oxide layer could then be oxidized by exposing the layer to essentially oxygen at a partial pressure in the range of $1\times10^{-8}$ to $1\times10^{-6}$ Torr at a temperature in the range of 25° C. to 200° C. to form an epitaxial oxidized film structure. The method may further comprise the step of annealing the surface of the epitaxial oxidized film structure while under a vacuum in which the pressure is less than $1\times10^{-8}$ Torr, preferably less than $5\times10^{-9}$ Torr, to further stabilize the epitaxial oxidized film structure. Such annealing may be performed prior to, or concurrently with, any subsequent crystalline metal oxide deposition. The crystalline metal oxide structure could be made by providing the epitaxial oxidized film structure and then depositing on the epitaxial oxidized film structure at least one metal oxide layer using any of a variety of known methods including MBE, CVD, and e-beam evaporation. The at least one metal oxide layer may comprise, but is not limited to, SrO, $SrTiO_3$, BaO, $BaTiO_3$, $SrTiO_3$, and combinations thereof. Furthermore, in cases whereby more than one metal oxide layer is deposited on the epitaxial oxidized film structure, each layer may comprise a different metal oxide (e.g., an oxidized film structure with a deposited BaO layer thereon followed by a deposited $BaTiO_3$ layer).

A funnel and a lens on the funnel to channel electromagnetic radiation such as light into the nanowire waveguide could then be made as follows: deposition of a glass/oxide/dielectric layer by CVD, sputter deposition or spin-on coating; application of a photoresist on the deposited glass/oxide/dielectric layer; removal of the photoresist outside an opening centered over the nanowire within the deep cavity; and forming a coupler by semi-isotropic etching in the glass/oxide/dielectric layer.

Subsequent steps could relate to the forming of a metal or metal oxide layer around the one or more dielectric layers by depositing a metal such a copper on the vertical walls of the nanowire surrounding the one or more dielectric layers.

All references mentioned in the application are incorporated herein in their entirety by reference.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

In one embodiment, several portions of the subject matter described herein may be implemented by a control system, such as Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs having computer-executable instructions or code running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one skilled in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of computer-readable medium used to actually carry out the distribution.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A device comprising a substrate, a nanowire and a doped layer surrounding the nanowire, a reflective layer disposed on the substrate, wherein the nanowire is configured to be both a channel to transmit light with wavelengths up to a selective wavelength and an active element to detect light with the wavelengths up to the selective wavelength transmitted through the nanowire; wherein the reflective layer is configured to reflect light transmitted by the nanowire.

2. The device of claim 1, wherein the doped layer surrounds a part of or all of the nanowire.

3. The device of claim 1, further comprising a metal-containing layer surrounding the doped layer.

4. The device of claim 3, wherein the metal-containing layer is configured to confine light within the metal-containing layer and function as an electronic component.

5. The device of claim 3, wherein the metal-containing layer is configured to confine light within the metal-containing layer and not function as an electronic component.

6. The device of claim 1, further comprising a dielectric layer surrounding the doped layer.

7. The device of claim 1, wherein the doped layer is an epitaxial layer on the nanowire.

8. The device of claim 1, wherein the substrate has a front side and a back-side, the nanowire disposed on the back-side and an image sensing circuit disposed on the front side.

9. The device of claim 1, wherein the substrate has a front side and a back-side, wherein both the nanowire and an image sensing circuit are disposed on the front side.

10. The device of claim 1, wherein the nanowire is not transparent.

11. The device of claim 1, wherein the device does not include a color or infra-red filter.

12. The device of claim 1, wherein the nanowire comprises a semiconductor.

13. The device of claim 1, further comprising a lens structure or an optical coupler over the nanowire, wherein the lens structure or the optical coupler is operably coupled to the nanowire.

14. The device of claim 1, further comprising an anti-reflective layer disposed on the substrate.

15. The device of claim 1, wherein the device is an image sensor.

16. The device of claim 1, wherein the selective wavelength is a function of the diameter of the nanowire.

17. The device of claim 1, wherein the nanowire comprises a PN or PIN junction.

18. The device of claim 1, wherein the doped layer is p-doped.

19. The device of claim 1, wherein the doped layer is n-doped.

20. The device of claim 1, wherein the nanowire is doped or undoped.

21. The device of claim 1, further comprising one or more photogates surrounding the nanowire.

22. The device of claim 21, further comprising a dielectric layer between the nanowire and the one or more photogates.

23. The device of claim 21, wherein the substrate has a front side and a back-side, the nanowire disposed on the back-side and an image sensing circuit disposed on the front side.

24. The device of claim 21, wherein the substrate has a front side and a back-side, wherein both the nanowire and an image sensing circuit are disposed on the front side.

25. The device of claim 21, wherein the device does not include a color or infra-red filter.

26. The device of claim 21, further comprising an anti-reflective layer disposed on the substrate.

27. The device of claim 21, wherein the device is an image sensor.

28. The device of claim 21, wherein the selective wavelength is a function of the diameter of the nanowire.

29. The device of claim 21, further comprising photodiode disposed in or on the substrate.

30. The device of claim 21, the one more photogates comprises a first photogate configured to be a switch and a second photogate configured to control a potential in the nanowire.

31. The device of claim 21, wherein the one or more photogates comprises an epitaxial metal or metal oxide layer.

32. The device of claim 1, wherein the nanowire is an upstanding nanowire protruding from the substrate.

33. The device of claim 1, wherein the reflective layer comprises a multilayered structure comprising repeated layers of silicates.

34. The device of claim 1, wherein the reflective layer comprises a metal film.

* * * * *